US012581911B2

(12) United States Patent (10) Patent No.: US 12,581,911 B2

Nakazawa et al. (45) Date of Patent: Mar. 17, 2026

(54) SUBSTRATE PROCESSING APPARATUS

(71) Applicant: SCREEN Holdings Co., Ltd., Kyoto (JP)

(72) Inventors: Kazuhiko Nakazawa, Kyoto (JP); Toshihito Morioka, Kyoto (JP); Hiromichi Kaba, Kyoto (JP); Takashi Ota, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 667 days.

(21) Appl. No.: 17/948,848

(22) Filed: Sep. 20, 2022

(65) Prior Publication Data

US 2023/0290670 A1 Sep. 14, 2023

(51) Int. Cl.
*H01L 21/687* (2006.01)
*H01L 21/67* (2006.01)
*H01L 21/683* (2006.01)

(52) U.S. Cl.
CPC .. *H01L 21/68785* (2013.01); *H01L 21/67017* (2013.01); *H01L 21/67051* (2013.01); *H01L 21/6708* (2013.01); *H01L 21/6838* (2013.01); *H01L 21/68735* (2013.01); *H01L 21/6875* (2013.01); *H01L 21/68792* (2013.01); *H01L 21/68728* (2013.01)

(58) Field of Classification Search
None
See application file for complete search history.

(56) References Cited

U.S. PATENT DOCUMENTS

2006/0144429 A1 7/2006 Langen ........................ 134/95.3
2007/0240824 A1* 10/2007 Kaneko ............ H01L 21/67051
118/52
2009/0101181 A1* 4/2009 Morisawa ........ H01L 21/67051
134/115 R
(Continued)

FOREIGN PATENT DOCUMENTS

JP H10-092912 A 4/1998
JP 2009-142818 A 7/2009
(Continued)

OTHER PUBLICATIONS

Decision to Grant for corresponding Japanese Patent Application No. 2021-154038, dated Jul. 24, 2025, English Translation attached.
(Continued)

*Primary Examiner* — Binu Thomas
(74) *Attorney, Agent, or Firm* — OSTROLENK FABER LLP

(57) ABSTRACT

In a substrate holder, a gas supply part sends out a gas to the space between the lower surface of a substrate and a base surface of a base part to form a radially outward airflow. A division plate is arranged radially outward of the outer peripheral edge of the substrate on the base surface of the base part to surround the substrate. The inner peripheral edge of the division plate and the outer peripheral edge of the substrate face each other in the radial direction with a space in between. The upper surface of the division plate is located below or at the same position in the up-down direction as the upper surface of the substrate. An annular passage is provided between the lower surface of the division plate and the base surface of the base part.

4 Claims, 6 Drawing Sheets

(56) References Cited

U.S. PATENT DOCUMENTS

| | | | |
|---|---|---|---|
| 2012/0090649 A1 | 4/2012 | Takahashi et al. | |
| 2014/0137902 A1* | 5/2014 | Aiura | H01L 21/67051 |
| | | | 134/104.2 |
| 2015/0114561 A1* | 4/2015 | Higashijima | H01L 21/6715 |
| | | | 156/345.23 |
| 2015/0187613 A1* | 7/2015 | Wakiyama | H01L 21/67051 |
| | | | 134/95.1 |
| 2018/0294179 A1* | 10/2018 | Wang | H01L 21/67051 |
| 2018/0337068 A1 | 11/2018 | Ota et al. | |
| 2019/0252214 A1* | 8/2019 | Okita | H01L 21/67051 |
| 2021/0086236 A1 | 3/2021 | Nakazawa et al. | |
| 2022/0415697 A1 | 12/2022 | Yasutake et al. | |

FOREIGN PATENT DOCUMENTS

| | | | |
|---|---|---|---|
| JP | 2012-094836 A | 5/2012 | |
| JP | 2013-093407 A | 5/2013 | |
| JP | 2018-517293 A | 6/2018 | |
| JP | 2021-039989 A | 3/2021 | |
| JP | 2021-048361 A | 3/2021 | |
| JP | 2021-048362 A | 3/2021 | |
| TW | 202115773 A | 4/2021 | |
| TW | 202116126 A | 4/2021 | |
| TW | 202125685 A | 7/2021 | |
| TW | 202131437 A | 8/2021 | |
| TW | 202133249 A | 9/2021 | |

OTHER PUBLICATIONS

Office Action issued on Apr. 14, 2023 for corresponding Taiwanese Patent Application No. 111134830.

Office Action for corresponding Japanese Patent Application No. 2021-154038 issued on Mar. 27, 2025. English translation attached.

Office Action for corresponding Chinese Patent Application No. 202211113899.9 issued on May 24, 2025. English translation attached.

* cited by examiner

VI—VI

SUBSTRATE PROCESSING APPARATUS

CROSS-REFERENCE TO RELATED APPLICATIONS

This application claims priority benefit of Japanese Patent Application No. JP2021-154038 filed in the Japan Patent Office on Sep. 22, 2021, the entire disclosure of which is incorporated herein by reference.

TECHNICAL FIELD

The present invention relates to a substrate processing apparatus for processing substrates.

BACKGROUND ART

A conventional process of manufacturing semiconductor substrates (hereinafter, simply referred to as "substrates") includes various types of processing that are performed on the substrates. For example, liquid processing may be performed on a substrate held in a horizontal position by a substrate holder by rotating the substrate and supplying a processing liquid to the surface of the rotating substrate.

The wet etching device disclosed in Japanese Patent Application Laid-Open No. 2009-142818 (Document 1) uses a Bernoulli chuck as a substrate holder that holds substrates, the Bernoulli chuck supplying high pressure gas between a substrate and a support located below the substrate and sucking the substrate toward the support using a negative pressure created by a gas flowing along the lower surface of the substrate. This gas is supplied from a ring-shaped nozzle to the space between the substrate and the supporter, the ring-shaped nozzle being formed on the upper surface of the support at a position below the outer peripheral portion of the substrate. The support includes a ring-shaped gas discharge part that extends from the ring-shaped nozzle to an area radially outward of the outer peripheral edge of the substrate and that is spaced below from the substrate. Below the gas discharge part, an annular gas exhaust passage is provided that extends radially outward and downward from the aforementioned ring-shaped nozzle.

In the wet etching device, an etchant that is supplied to the upper surface of the substrate flows around to the lower surface side from the outer peripheral edge of the substrate and fills clearance between the peripheral edge portion of the lower surface of the substrate and the upper surface of the gas discharge part. Accordingly, an etching process is performed on the peripheral edge portion of the lower surface of the substrate. The etchant flowing around to the lower surface of the substrate is discharged radially outward through the gas exhaust passage. The gas supplied between the substrate and the support from the ring-shaped nozzle is also discharged radially outward through the gas exhaust passage.

Unlike the etching process described in Document 1, liquid processing that is performed on a substrate may in some cases have to prevent a processing liquid supplied to the upper surface of the substrate from flowing around to the lower surface of the substrate. However, in the case where the Bernoulli chuck is used to hold a substrate as in Document 1, a processing liquid or the like that is supplied to the upper surface of the substrate and flows down from the outer peripheral edge of the substrate may be sucked by the negative pressure created between the substrate and the support and may flow around to the lower surface of the substrate. Moreover, in the case where the substrate holder has protrusions such as centering pins provided on the outer side of the outer peripheral edge of the substrate, a processing liquid dispersed from the rotating substrate may collide with these protrusions, and particulate matter such as water droplets or mist produced by the collision may fly around to the underside of the substrate and adhere to the lower surface of the substrate.

SUMMARY OF THE INVENTION

The present invention is intended for a substrate processing apparatus for processing substrates, and it is an object of the present invention to suppress the adhesion of a processing liquid to the lower surface of a substrate.

A substrate processing apparatus according to one preferable embodiment of the present invention includes a substrate holder that holds a substrate in a horizontal position, a substrate rotation mechanism that rotates the substrate holder about a central axis extending in an up-down direction, and a processing liquid supply part that supplies a processing liquid to an upper surface of the substrate. The substrate holder include a base part having a base surface that faces a lower surface of the substrate and that extends radially outward from an outer peripheral edge of the substrate, a plurality of support pins that are arranged in a circumferential direction on the base surface, that project upward from the base surface, and that come in contact with an outer peripheral portion of the lower surface of the substrate, a gas supply part that sends out a gas to a space between the lower surface of the substrate and the base surface of the base part to form an airflow that flows radially outward, and a ring-shaped division plate that is arranged radially outward of the outer peripheral edge of the substrate on the base surface of the base part to surround a circumference of the substrate. An inner peripheral edge of the division plate and the outer peripheral edge of the substrate face each other in a radial direction with a space in between. The division plate has an upper surface that is located below or at the same position in the up-down direction as the upper surface of the substrate. An annular passage is provided between a lower surface of the division plate and the base surface of the base part. The division plate is fixedly attached to the base part and is rotated together with the base part by the substrate rotation mechanism.

The substrate processing apparatus is capable of suppressing the adhesion of a processing liquid to the lower surface of the substrate.

Preferably, the substrate holder produces a pressure drop in a space between the substrate and the base part by a Bernoulli effect resulting from the airflow to adsorb the substrate.

Preferably, the lower surface of the division plate is an inclined surface that is inclined downward in a radially outward direction.

Preferably, a distance in the up-down direction between the base surface and the lower surface of the substrate at a radial position at which the substrate comes in contact with the plurality of support pins is smaller than a distance in the up-down direction between the base surface and the lower surface of the division plate at a position below the inner peripheral edge of the division plate.

Preferably, the substrate holder further includes a pin that protrudes upward from the base surface at a position radially outward of the substrate, the pin has an upper end portion that is inserted in an opening formed in the division plate, and the pin has an upper end that is located below or at the same position in the up-down direction as a region of the upper surface of the division plate that is located around the opening.

These and other objects, features, aspects and advantages of the present invention will become more apparent from the following detailed description of the present invention when taken in conjunction with the accompanying drawings.

Figure 3:
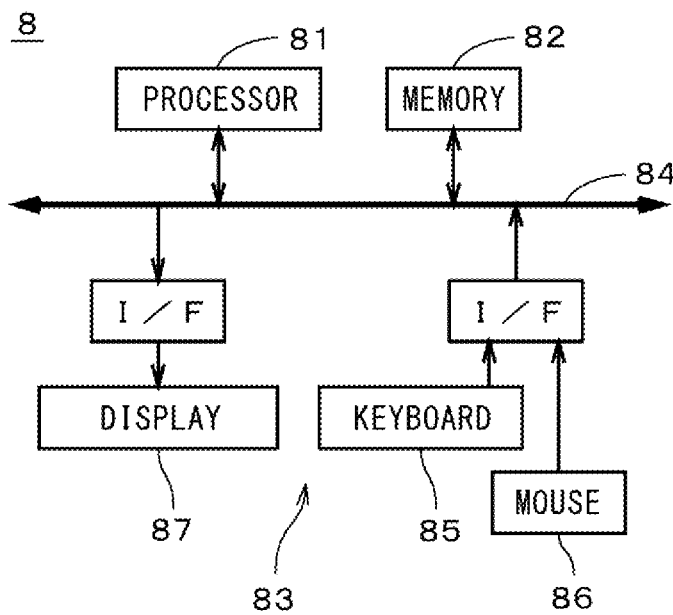
Figure 4:
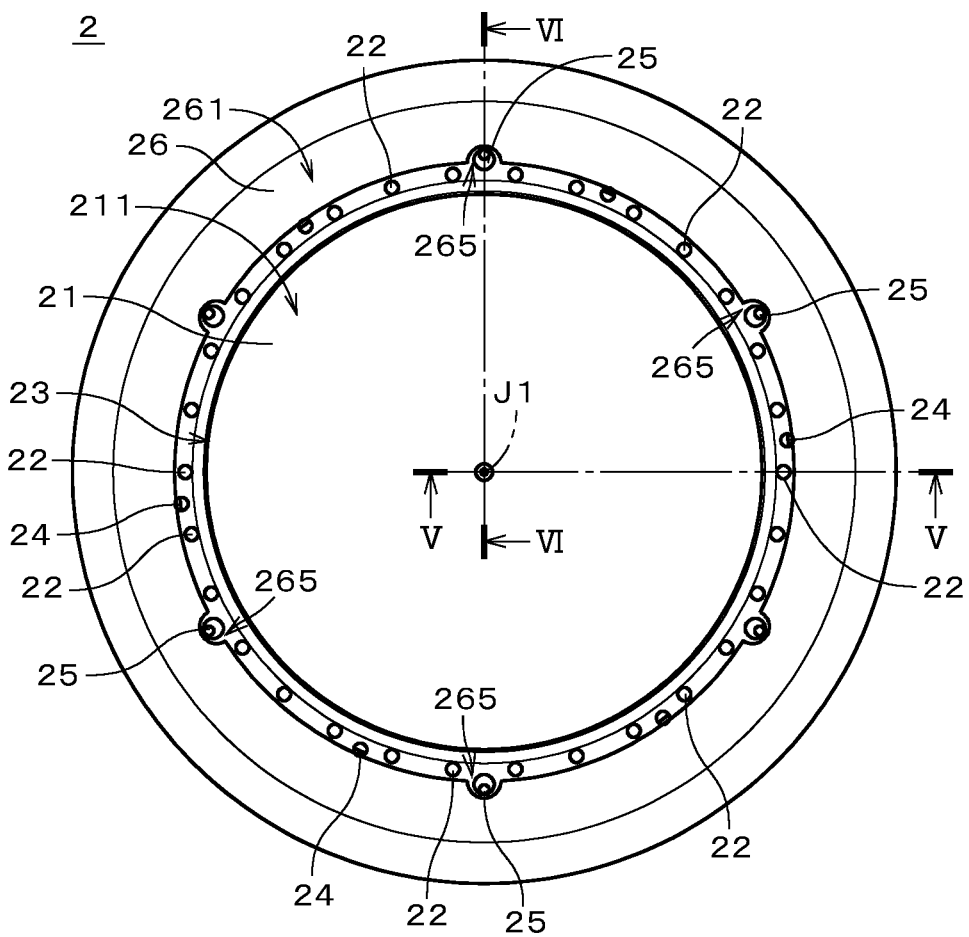
Figure 5:
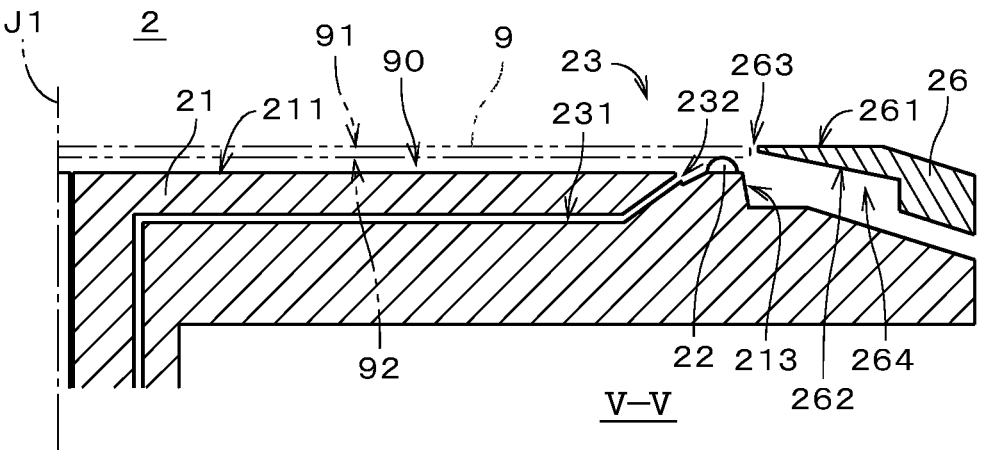
Figure 6:
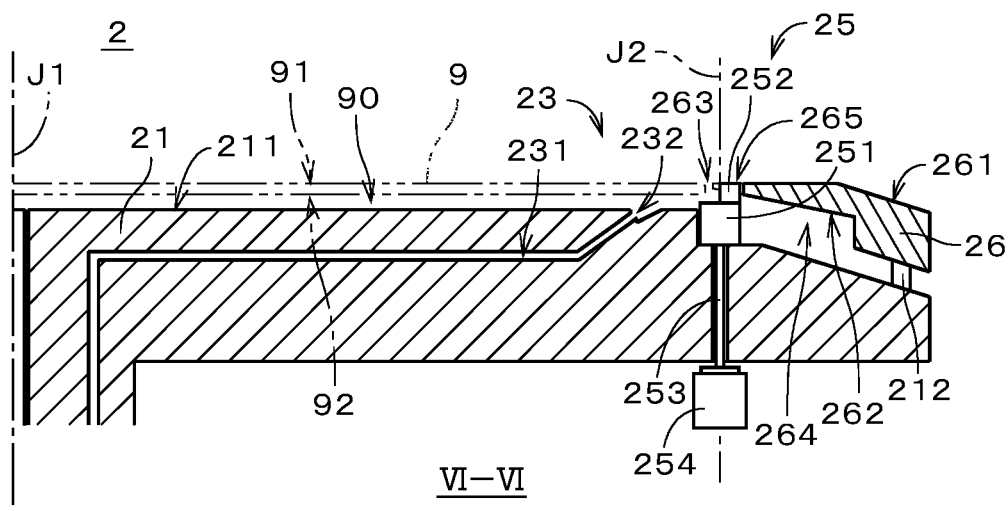
Figure 7:
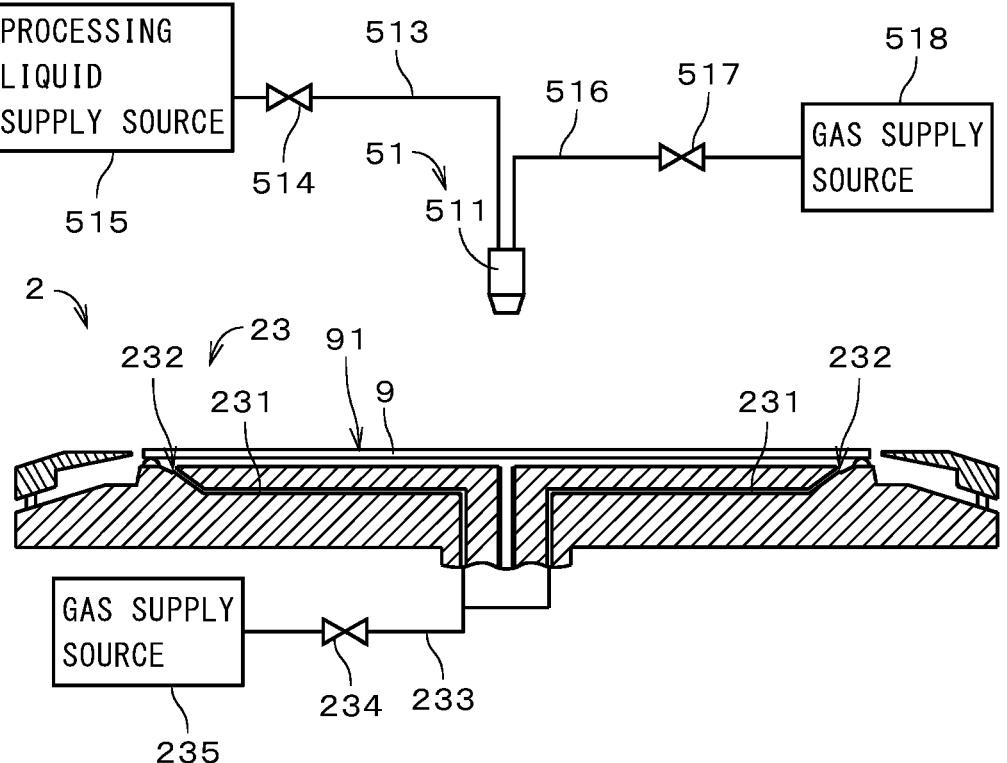
Figure 8:
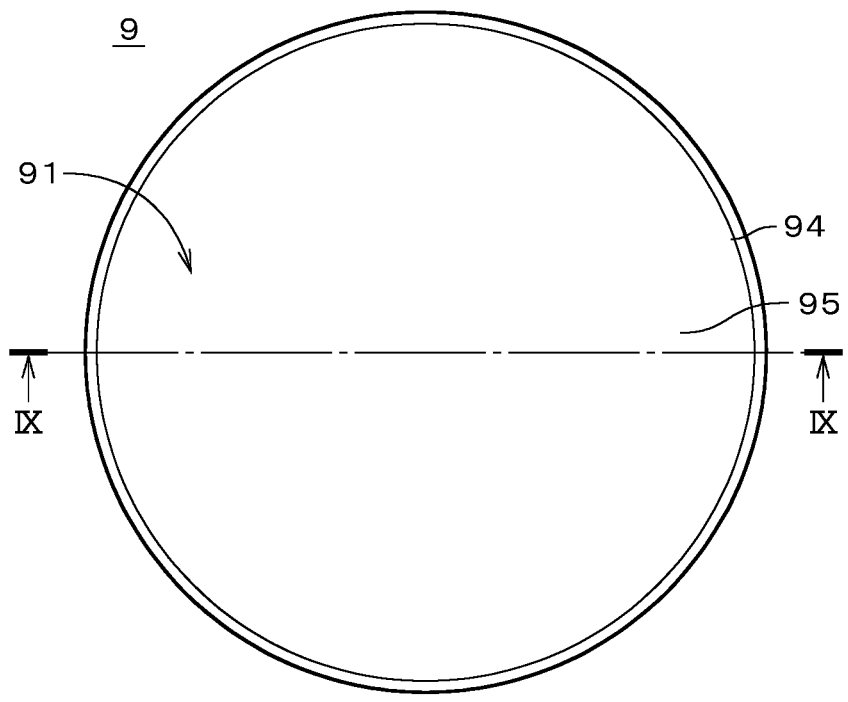
Figure 9:
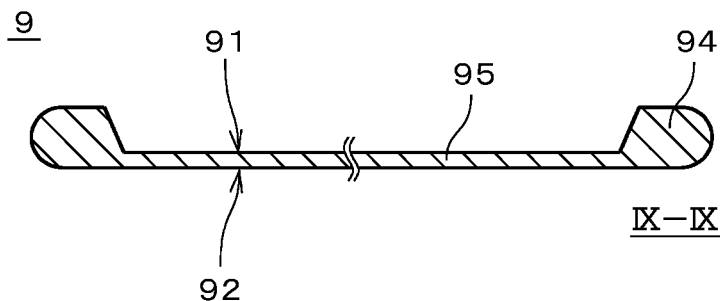

liquid;

FIG. 3 is an illustration of a configuration of a controller;

FIG. 4 is a plan view of a substrate holder;

FIG. 5 is a sectional view of part of the substrate holder;

FIG. 6 is a sectional view of part of the substrate holder;

FIG. 7 is a block diagram for describing a configuration relating to the supply of gas and FIG. 8 is a plan view of a substrate;

FIG. 9 is a sectional view of the substrate; and

Figure 10:
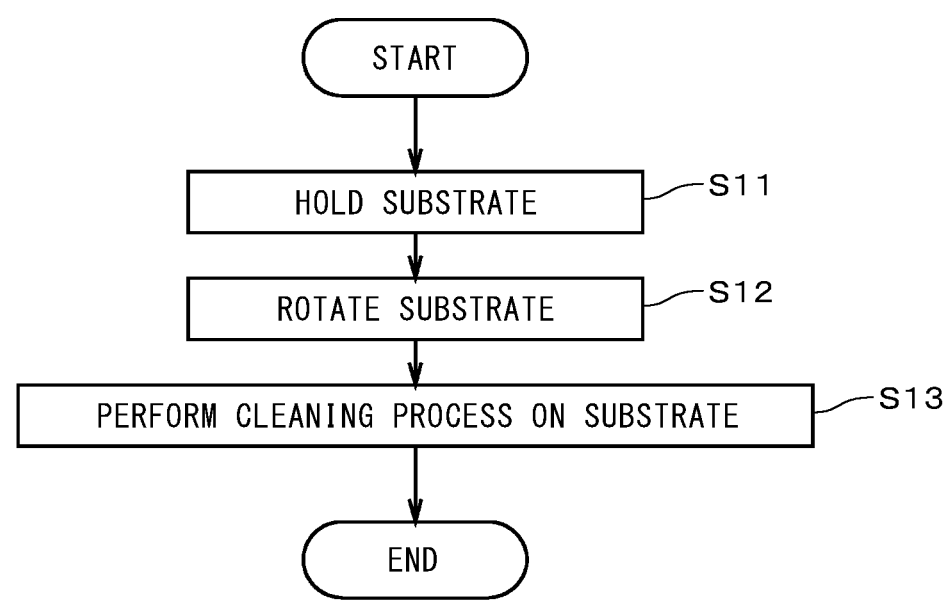

FIG. 10 is a flowchart of processing that is performed on a substrate.

DETAILED DESCRIPTION

Figure 1:
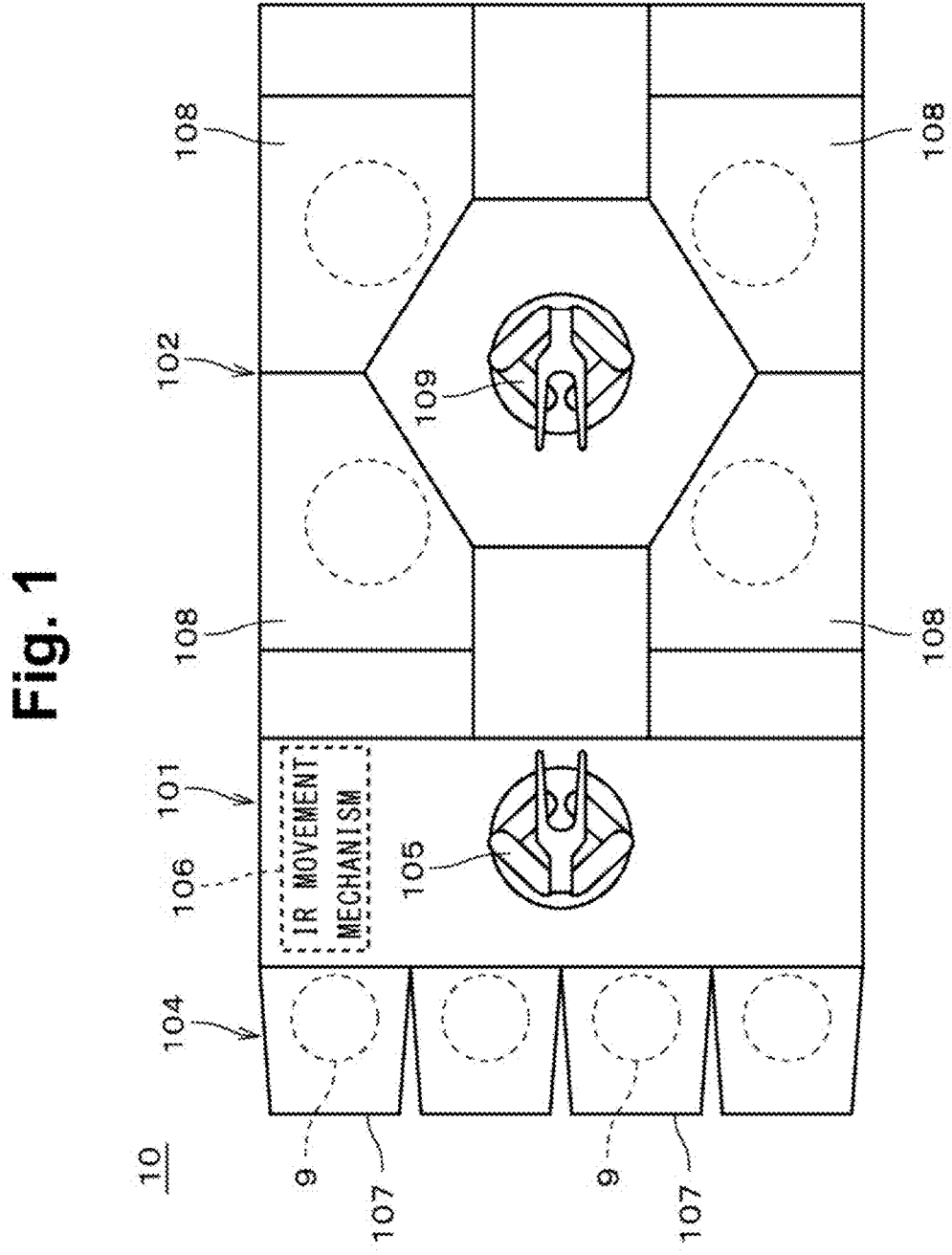
FIG. 1 is a plan view illustrating a substrate processing system according to one embodiment.

FIG. 1 is a diagrammatic plan view illustrating a layout of a substrate processing system 10 that includes a substrate processing apparatus according to one embodiment of the present invention. The substrate processing system 10 is a system for processing semiconductor substrates 9 (hereinafter, simplify referred to as "substrates 9"). The substrate processing system 10 includes an indexer block 101 and a processing block 102 coupled to the indexer block 101.

The indexer block 101 includes a carrier holder 104, an indexer robot 105, and an IR movement mechanism 106. The carrier holder 104 holds a plurality of carriers 107 each capable of housing a plurality of substrates 9. The carriers 107 (e.g., FOUPs), which are aligned in a predetermined carrier alignment direction, are held by the carrier holders 104. The IR movement mechanism 106 moves the indexer robot 105 in the carrier alignment direction. The indexer robot 105 performs an export operation of transporting substrates 9 out of the carriers 107 and an import operation of transporting substrates 9 into the carriers 107 held by the carrier holders 104. The substrates 9 are transported in a horizontal position by the indexer robot 105.

The processing block 102 includes a plurality of (e.g., four or more) processing units 108 that process substrates 9, and a center robot 109. The processing units 108 are arranged so as to surround the center robot 109 in plan view. The processing units 108 perform various types of processing on substrates 9. The substrate processing apparatus described later is one of the processing units 108. The center robot 109 performs an import operation of transporting substrates 9 into the processing units 108 and an export operation of transporting substrates 9 out of the processing units 108. The center robot 109 further transports substrates 9 among the processing units 108. The substrates 9 are transported in a horizontal position by the center robot 109. The center robot 109 receives a substrate 9 from the indexer robot 105 and transfers the substrate 9 to the indexer robot 105.

Figure 2:
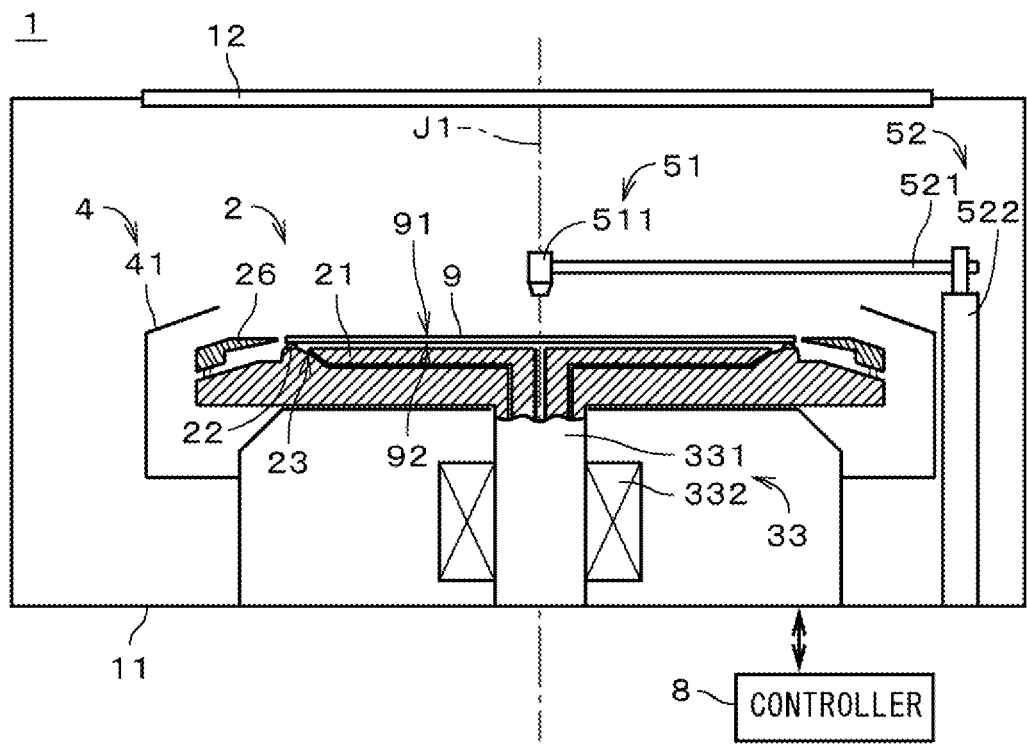
FIG. 2 is a side view illustrating a configuration of a substrate processing apparatus.

FIG. 2 is a side view illustrating a configuration of a substrate processing apparatus 1. FIG. 2 illustrates a section of part of the configuration of the substrate processing apparatus 1. The substrate processing apparatus 1 is a single wafer processing apparatus that processes substrates 9 one by one. The substrate processing apparatus 1 performs liquid processing by supplying a processing liquid to a substrate 9. The liquid processing includes, for example, removing foreign materials adhering to a substrate 9 (i.e., cleaning) before processing of transporting the substrate 9 into the substrate processing apparatus 1. The foreign materials may, for example, be residues that are left on the surfaces of the substrate 9 during a grinding process performed on the substrate 9. In the following description, the upper and lower sides in FIG. 2 may also be referred to simply as "upper and lower sides."

The substrate processing apparatus 1 includes a substrate holder 2, a substrate rotation mechanism 33, a cup part 4, a processing part 51, a processing-part movement mechanism 52, a controller 8, and a chamber 11. Constituent elements such as the substrate holder 2, the substrate rotation mechanism 33, the cup part 4, and the processing part 51 are housed in an internal space of the chamber 11. The chamber 11 has a canopy portion that is provided with an airflow forming part 12 that supplies a gas to the internal space and forms an airflow (so-called downflow) that flows downward. The airflow forming part 12 may, for example, be a fan filter unit (FFU).

The controller 8 is arranged outside the chamber 11 and controls constituent elements such as the substrate holder 2, the substrate rotation mechanism 33, the processing part 51, and the processing-part movement mechanism 52. As illustrated in FIG. 3, the controller 8 may, for example, be an ordinary computer system that includes a processor 81, a memory 82, an input/output unit 83, and a bus 84. The bus 84 is a signal circuit that connects the processor 81, the memory 82, and the input/output unit 83. The memory 82 stores programs and various types of information. The processor 81 executes various types of processing (e.g., numerical calculations) in accordance with, for example, the programs stored in the memory 82, using the memory 82 or other constituent elements. The input/output unit 83 may include, for example, a keyboard 85 and a mouse 86 that accept input from an operator, a display 87 that displays, for example, outputs received from the processor 81, and a transmitter (not shown) that transmits, for example, outputs received from the processor 81. Note that the controller 8 may, for example, be a programmable logic controller (PLC) or a circuit board. The controller 8 may include a plurality of arbitrary configurations among, for example, the computer system, the PLC, and the circuit board.

The substrate holder 2 and the substrate rotation mechanism 33 are parts of a spin chuck that holds and rotates an approximately disk-like substrate 9. The substrate holder 2 holds a substrate 9 in a horizontal position from the underside. The substrate holder 2 may, for example, be a Bernoulli chuck that adsorbs and holds a substrate 9 by the Bernoulli effect. Note that the substrate holder 2 may be any other chuck having a different structure.

FIG. 4 is a plan view of the substrate holder 2. FIG. 5 is a sectional view of the substrate holder 2 taken at a position V-V in FIG. 4. FIG. 6 is a sectional view of the substrate holder 2 taken at a position VI-VI in FIG. 4. In FIGS. 5 and 6, the substrate 9 held by the substrate holder 2 is indicated by chain double-dashed lines. As illustrated in FIGS. 4 to 6, the substrate holder 2 includes a base part 21, a plurality of support pins 22, and a gas supply part 23.

The base part 21 is an approximately disk-like member having a central axis J1 extending in the up-down direction as its center. The substrate 9 is arranged above the base part 21 with a space in between. The base part 21 has an upper main surface 211 (hereinafter, also referred to as a "base surface 211") that faces a lower main surface 92 of the substrate 9 (hereinafter, also referred to as the "lower surface 92) in the up-down direction at a position spaced below the lower surface 92 of the substrate 9. The base surface 211 of the base part 21 and the lower surface 92 of the substrate 9 are approximately horizontal to each other. The diameter of the base part 21 is slightly greater than the diameter of the substrate 9, so that the base surface 211 extends radially outward along the entire circumference from the outer peripheral edge of the substrate 9.

The support pins 22 are aligned with a space in between in a circumferential direction having the central axis J1 as its center (hereinafter, also simply referred to as the "circumferential direction") on the outer peripheral portion of the base surface 211 of the base part 21. The support pins 22 are arranged on the same circumference having the central axis J1 as its center. For example, the support pins 22 may be arranged at approximately equiangular intervals in the circumferential direction. In the example illustrated in FIG. 4, the number of support pins 22 is 30. The support pins 22 are protrusions that protrude upward from the base surface 211. Each support pin 22 may have, for example, an approximately hemispherical shape. The support pins 22 are fixedly attached to the base part 21 and do not move relative to the base part 21. In the substrate holder 2, the support pins 22 come in contact with the outer peripheral portion of the lower surface 92 of the substrate 9 and support the substrate 9 from the underside. Accordingly, the substrate holder 2 holds the substrate 9 in an approximately horizontal position while being in contact with the outer peripheral portion of the substrate 9 at the support pins 22 and not being in contact with the central portion of the lower surface 92 of the substrate 9.

The gas supply part 23 includes a plurality of gas delivery ports 232 provided in the base surface 211 of the base part 21. The gas delivery ports 232 are arranged below and spaced from the lower surface 92 of the substrate 9 at a position overlapping with the substrate 9 in plan view. The gas delivery ports 232 are aligned with a space in between in the circumferential direction at a position spaced radially outward from the central axis J1. The gas delivery ports 232 are arranged on the same circumference having the central axis J1 as its center. The number of gas delivery ports 232 may, for example, be 150. The gas delivery ports 232 are arranged radially inward of the support pins 22. The gas delivery ports 232 are arranged below the outer peripheral portion of the substrate 9. In the example illustrated in FIGS. 5 and 6, the gas delivery ports 232 are provided in the radially inward side surface of an annular groove that is formed in the base surface 211 and has an approximately V shape in longitudinal cross section formed on the base surface 211. The shape of the gas delivery ports 232 as viewed in a direction perpendicular to this side surface may, for example, be approximately circular. Each gas delivery port 232 is connected to a gas supply source 235 (see FIG. 7) described later via a gas passage 231 provided inside the base part 21.

The gas supply part 23 sends out a gas from the gas delivery ports 232 to the space between the lower surface 92 of the substrate 9 and the base surface 211 of the base part 21 (hereinafter, also referred to as the "lower space 90"). The gas may be an inert gas such as a nitrogen gas, or may, for example, be air. The gas may, for example, be a high pressure gas or a compressed gas. The gas supplied from the gas delivery ports 232 to the lower space 90 flows radially outward along the lower surface 92 of the substrate 9. This forms an airflow that flows radially outward from a radial central portion (hereinafter, also simply referred to as a "central portion") in the lower space 90, and a pressure drop occurs in the lower space 90 due to the Bernoulli effect resulting from the airflow. As a result, the substrate 9 is adsorbed by the substrate holder 2. In other words, the atmospheric pressure in the lower space 90 becomes lower than the atmospheric pressure above the substrate 9 (i.e., becomes a negative pressure), and this causes the substrate 9 to be pressed against the support pins 22 due to the difference in atmospheric pressure between above and below the substrate 9 and accordingly fixes the position of the substrate 9 (i.e., hold the substrate 9). With the substrate 9 held by the substrate holder 2, the base part 21 and the gas delivery ports 232 are spaced below from the substrate 9 and are not in contact with the substrate 9.

In the example illustrated in FIGS. 5 and 6, portions of the gas passage 231 that are located in the vicinity of the gas delivery ports 232, the gas passage 231 being provided inside the base part 21, extend radially outward and diagonally upward toward the gas delivery ports 232. Thus, the gas sent out from the gas delivery ports 232 to the lower space 90 flows radially outward and upward from the gas delivery ports 232 and flows approximately horizontally and radially outward along the lower surface 92 of the substrate 9. This forms an airflow that flows radially outward from the central portion in the lower space 90 as described above, so that the substrate 9 supported from the underside by the support pins 22 is sucked downward by the Bernoulli effect and held by the substrate holder 2.

In the substrate holder 2, the downward suction force acting on the substrate 9 increases with increasing flow rate of the gas sent out from the gas delivery ports 232. In the state in which the substrate 9 is not adsorbed by the substrate holder 2, the substrate 9 can be easily moved upward away from the support pins 22. Alternatively, it is also possible to move the substrate 9 approximately horizontally while being in contact at the support pins 22 (i.e., to slide the substrate 9 sideway on the support pins 22).

As illustrated in FIGS. 4 and 6, the substrate holder 2 includes a plurality of lift pins 24 and a plurality of centering pins 25. The lift pins 24 serve to transfer the substrate 9 among the support pins 22 when the substrate 9 is transported into and out of the substrate processing apparatus 1. The centering pins 25 serve to adjust the horizontal position of the substrate 9 by pressing, in the horizontal direction, the outer peripheral edge of the substrate 9 that is placed on the support pins 22 but not adsorbed.

The lift pins 24 are aligned with a space in between in the circumferential direction on the outer peripheral portion of the base surface 211 of the base part 21. The lift pins 24 are arranged on the same circumference having the central axis J1 as its center. For example, the lift pins 24 may be arranged at approximately equiangular intervals in the circumferential direction. In the example illustrated in FIG. 4, the number of lift pins 24 is six. The lift pins 24 are located slightly radially outward of the support pins 22. The lift pins 24 protrude upward from the base surface 211. Each lift pin 24 may have, for example, an approximately columnar shape. Radially inward portions of the tops of the lift pins 24 are notched so as to come in contact with the lower surface 92 and outer peripheral edge (i.e., side face) of the substrate 9 at this top. That is, the radially outward portions of the lift pins 24 are located radially outward of the outer peripheral edge of the substrate 9.

The lift pins 24 are movable in the up-down direction relative to the base surface 211 of the base part 21. The lift pins 24 receives and holds a substrate 9 above the support pins 22. The lift pins 24 are then moved downward together with the substrate 9 so that the substrate 9 is transferred to the support pins 22. When the lift pins 24 are moved upward from below the support pins 22 to hold the substrate 9 and further moved upward, the substrate 9 is transferred from the support pins 22 to the lift pins 24.

The centering pins 25 are aligned with a space in between in the circumferential direction on the outer peripheral portion of the base surface 211 of the base part 21. The centering pins 25 are arranged on the same circumference having the central axis J1 as its center. For example, the centering pins 25 may be arranged at approximately equiangular intervals in the circumferential direction. In the example illustrated in FIG. 4, the number of centering pins 25 is six. The centering pins 25 are located slightly radially outward of the support pins 22 and the lift pins 24. The centering pins 25 are also located radially outward of the outer peripheral edge of the substrate 9. Each of the centering pins 25 is a pin that protrudes upward from the base surface 211.

In the example illustrated in FIG. 6, the centering pins 25 each have an approximately columnar lower pin portion 251 and an approximately columnar upper pin portion 252 that protrudes upward from the upper end of the lower pin portion 251. The upper pin portion 252 is thinner than the lower pin portion 251 (i.e., has a smaller diameter in section perpendicular to the up-down direction) and is fixedly attached to the lower pin portion 251 at a position eccentric from a central axis J2 of the lower pin portion 251 in the radial direction. The lower pin portion 251 is located below the lower surface 92 of the substrate 9 in the up-down direction. The upper pin portion 252 is located at approximately the same position as the substrate 9 in the up-down direction. The lower pin portion 251 and the upper pin portion 252 are located radially outward of the outer peripheral edge of the substrate 9. A radially inward portion of the lower pin portion 251 overlaps with the substrate 9 in plan view. The upper pin portion 252 faces the outer peripheral edge of the substrate 9 in the radial direction with a space in between.

The lower pin portion 251 of each centering pin 25 is connected to a pin rotation mechanism 254 via a shaft 253 that penetrates the base part 21 in the up-down direction. For example, the pin rotation mechanism 254 may be an electric rotary motor. When the shaft 253 is rotated by the pin rotation mechanism 254, the centering pins 25 rotate above the central axis J2 extending in the up-down direction on the base surface 211 of the base part 21. This changes the radial positions of the upper pin portions 252. In the substrate holder 2, the plurality of centering pins 25 each rotate with the upper pin portions 252 in contact with the outer peripheral edge of the substrate 9, so that the substrate 9 slides on the support pins 22 in the horizontal direction, and the horizontal position of the substrate 9 is adjusted.

As illustrated in FIGS. 4 to 6, the substrate holder 2 further includes a division plate 26. The division plate 26 is an approximately circular ring-shaped member having the central axis J1 as its center and surrounds the entire circumference of the substrate 9. The division plate 26 is arranged radially outward of the outer peripheral edge of the substrate 9 and fixedly attached to the base surface 211 of the base part 21. The inner peripheral edge of the division plate 26 is located radially outward of the outer peripheral edge of the substrate 9 along the entire circumference. When viewed in plan view, an annular space 263 having an approximately circular ring shape is provided between the inner peripheral edge of the division plate 26 and the outer peripheral edge of the substrate 9. For example, the annular space 263 may have a radial width greater than or equal to 1 mm and less than or equal to 2 mm.

The inner peripheral edge of the division plate 26 and the outer peripheral edge of the substrate 9 are located at approximately the same position in the up-down direction. That is, the inner peripheral edge of the division plate 26 and the outer peripheral edge of the substrate 9 face each other in the radial direction with a space in between. The division plate 26 has an upper surface 261 that is located slightly below or at the same position in the up-down direction as the upper main surface of the substrate 9 (hereinafter, also referred to as the "upper surface 91"). The upper surface 261 of the division plate 26 extends approximately horizontally in a radially outward direction from the inner peripheral edge of the division plate 26 and further expands radially outward and downward to the outer peripheral edge of the division plate 26. The outer peripheral edge of the division plate 26 overlaps approximately with the outer peripheral edge of the base part 21 (i.e., the outer peripheral edge of the base surface 211) in plan view.

The division plate 26 is arranged at a position spaced above from the base surface 211 of the base part 21 and is fixedly attached to the base surface 211 of the base part 21 via a plurality of division plate supporters 212. Each division plate supporter 212 may, for example, be an approximately columnar member that protrudes upward from the base surface 211, and may be connected to the lower surface 262 of the division plate 26 to support the division plate 26 from the underside. The division plate supporters 212 are aligned in the circumferential direction with a space in between on the outer peripheral portion of the base surface 211 of the base part 21. For example, the division plate supporters 212 may be arranged on the same circumference having the central axis J1 as its center. The division plate supporters 212 may, for example, be arranged at approximately equiangular intervals in the circumferential direction. The number of division plate supporters 212 may, for example, be six. For example, the division plate supporters 212 may be arranged at approximately the same positions in the circumferential direction as the centering pins 25. The circumferential positions of the division plate supporters 212 do not necessarily have to be the same as the circumferential positions of the centering pins 25, and may be changed appropriately. An approximately annular gap (hereinafter, also referred to as an "annular passage 264") is provided between the lower surface 262 of the circular ring-shaped division plate 26 and the base surface 211 of the base part 21.

In the example illustrated in FIG. 5, the base surface 211 of the base part 21 extends approximately horizontally and radially outward from the central axis J1 and includes an inclined surface that extends radially outward and downward at position at which the gas delivery ports 232 are provided. The base surface 211 extends radially outward and upward from the lower end of the inclined surface and extends approximately horizontally in a radially outward direction at position at which the support pins 22 are provided. The base surface 211 further includes an inclined surface that extends radially outward and downward on the outer side of the support pins 22 in the radial direction. The inclined surface is a surface that extends sharply downward in a radially outward direction, and is located approximately vertically downward of the outer peripheral edge of the substrate 9. The base surface 211 includes a horizontal surface that extends approximately horizontally in a radially outward direction from the lower end of the inclined surface and faces the annular space 263 and the lower surface 262 of the division plate 26 in the up-down direction at a position spaced below the annular space 263 and the division plate 26. The base surface 211 further includes an inclined surface that extends radially outward and downward from the outer edge of the horizontal surface in the radial direction, and reaches the outer peripheral edge of the base part 21.

The lower surface 262 of the division plate 26 extends radially outward and downward from the inner peripheral edge of the division plate 26 to the outer peripheral edge of the division plate 26. In other words, the lower surface 262 of the division plate 26 is an inclined surface that extends downward in a radially outward direction. In the example illustrated in FIG. 5, the lower surface 262 of the division plate 26 extends radially outward and downward from the inner peripheral edge of the division plate 26, extends approximately vertically downward in a radial central portion of the division plate 26, and further extends radially outward and downward to the outer peripheral edge of the division plate 26. The height of the annular passage 264 in the up-down direction (i.e., the distance in the up-down direction between the base surface 211 and the lower surface 262 of the division plate 26) is approximately constant in the range between the inner peripheral edge of the division plate 26 and the radial central portion, then sharply decreases in the radial central portion of the division plate 26, and becomes approximately constant in the range between the radial central portion and outer peripheral edge of the division plate 26.

In the example illustrated in FIG. 5, the height of the lower space 90 in the up-down direction (i.e., the distance in the up-down direction between the base surface 211 and the lower surface 262 of the substrate 9) at a radial position at which the substrate 9 comes in contact with the support pins 22 is smaller than the height of the annular passage 264 in the up-down direction at the inner peripheral edge of the division plate 26. As described above, since the base surface 211 has a sharp inclined surface 213 that is located approximately vertically downward of the outer peripheral edge of the substrate 9, the height of the lower space 90 in the up-down direction sharply increases at a position that is approximately vertically downward of the outer peripheral edge of the substrate 9, and then the lower space 90 is connected with the annular passage 264. In other words, the height of the lower space 90 in the up-down direction sharply increases at a position radially outward of the support pins 22 and radially inward of the inner peripheral edge of the division plate 26 (i.e., in the vicinity of the annular space 263), and then the lower space 90 is connected with the annular passage 264. Note that the inclined surface 213 may be located radially outward of the support pins 22 and radially inward of the outer peripheral edge of the substrate 9.

As illustrated in FIG. 4, the inner peripheral edge of the division plate 26 has approximately semicircular openings 265 (i.e., notches) in the vicinity of the centering pins 25, so that the centering pins 25 can fit in these openings 265. In the example illustrated in FIG. 6, the upper end portions of the centering pin 25 are inserted in the openings 265 of the division plate 26. The upper ends of the centering pins 25 are located at approximately the same position in the up-down direction as regions of the upper surface 261 of the division plate 26 that are located around the openings 265. Alternatively, the upper ends of the centering pins 25 may be located below the regions of the upper surface 261 of the division plate 26 that are located around the openings 265.

The substrate rotation mechanism 33 illustrated in FIG. 2 is arranged below the substrate holder 2. The substrate rotation mechanism 33 rotates the substrate 9 together with the substrate holder 2 about the central axis J1. The substrate rotation mechanism 33 includes a shaft 331 and a motor 332. The shaft 331 is an approximately cylindrical member having the central axis J1 as its center. The shaft 331 extends in the up-down direction and is connected to the central portion of the lower surface of the base part 21 of the substrate holder 2. The motor 332 is an electric rotary motor that rotates the shaft 331. When the motor 332 rotates the shaft 331, the base part 21 connected to the shaft 331 and the division plate 26 fixedly attached to the base part 21 are rotated together. Note that the substrate rotation mechanism 33 may include any other motor having a different structure (e.g., a hollow motor).

The cup part 4 includes a ring-shaped cup 41 having the central axis J1 as its center. The cup 41 is arranged around the entire circumferences of the substrate 9 and the substrate holder 2 and covers side portions of the substrate 9 and the substrate holder 2. The cup 41 is a liquid receiver that receives a liquid such as a processing liquid dispersed from the rotating substrate 9 toward the surroundings. The cup 41 remains at rest and does not rotate in the circumferential direction, irrespective of whether the substrate holder 2 is being rotated or remains at rest. The cup 41 has a drain port (not shown) at the bottom, the drain port being a port through which the processing liquid or the like received by the cup 41 is discharged to the outside of the chamber 11.

The cup 41 is moved in the up-down direction by an elevating mechanism not shown. For example, the elevating mechanism may include an electric linear motor, an air cylinder, or a ball screw and an electric rotary motor. The cup part 4 may also include a plurality of cups 41 that are stacked in the radial direction. In the case where the cup part 4 includes a plurality of cups 41, these cups 41 are independently movable in the up-down direction and switched depending on the type of the processing liquid dispersed from the substrate 9 to receive the processing liquid.

The processing part 51 illustrated in FIG. 2 is a processing-liquid supply part that supplies a processing liquid (e.g., cleaning liquid) to the upper surface 91 of the substrate 9. The processing part 51 includes an upper nozzle 511 that ejects the processing liquid toward the upper surface 91 of the substrate 9. For example, the upper nozzle 511 may be a two-fluid nozzle that mixes the processing liquid with a gas and sprays the mixture toward the upper surface 91 of the substrate 9. In the processing part 51, the processing liquid is pulverized by collision with a high-rate flow of the gas and sprayed in a micronized state at a high rate to the upper surface 91 of the substrate 9. Accordingly, the upper surface 91 of the substrate 9 is cleaned physically, and foreign materials adhering to the upper surface 91 of the substrate 9 are removed. The processing liquid may, for example, be DIW or $CO_2$ water. The gas may be an inert gas such as a nitrogen gas, or may, for example, be air. For example, the gas may be a high pressure gas or a compressed gas.

The processing-part movement mechanism 52 is an oscillating mechanism that oscillates the upper nozzle 511 of the processing part 51 approximately horizontally in the space above the substrate 9. The processing-part movement mechanism 52 includes an arm 521 and an arm rotation mechanism 522. The arm 521 is a rod-like member that extends approximately horizontally. One end of the arm 521 is fixedly attached to the upper nozzle 511, and the other end thereof is connected to the arm rotation mechanism 522 located radially outward of the cup part 4. The arm rotation mechanism 522 rotates the arm 521 approximately horizontally about a rotation axis extending in the up-down direction.

The processing-part movement mechanism 5 reciprocally moves the upper nozzle 511, which ejects the processing liquid to the rotating substrate 9, between a first position and a second position, the first position facing the central portion of the upper surface 91 of the substrate 9 in the up-down direction, and the second position being located radially outward of the first position. It is preferable that the second position may face the outer peripheral portion of the upper surface 91 of the substrate 9 in the up-down direction. Accordingly the aforementioned physical cleaning process is performed on approximately the entire upper surface 91 of the substrate 9. After the cleaning process ends, the processing-part movement mechanism 52 moves the processing part 51 from the space above the substrate 9 to a retracted position that is located radially outward of the outer peripheral edge of the substrate 9. The arm rotation mechanism 522 of the processing-part movement mechanism 52 may include, for example, an electric rotary motor. The processing-part movement mechanism 52 may have any other structure.

FIG. 7 is a block diagram for describing configurations relating to the supply of gas and liquid in the substrate processing apparatus 1. In FIG. 7, each configuration is illustrated schematically and therefore does not always agree with the structure of the substrate processing apparatus 1 illustrated in FIGS. 2 and 4 to 6. The upper nozzle 511 is connected to the processing-liquid supply source 515 via piping 513 and a valve 514. The upper nozzle 511 is also connected to a gas supply source 518 via a duct 516 and a valve 517. In the processing part 51, when the valves 514 and 517 are opened under the control of the controller 8 (see FIG. 2), a processing liquid and a gas that are used in the cleaning process of the substrate 9 are supplied to the upper nozzle 511, which is a two-fluid nozzle, and a micronized processing liquid is sprayed from the upper nozzle 511 to the upper surface 91 of the substrate 9.

The gas passage 231 of the gas supply part 23 is connected to the gas supply source 235 via a duct 233 and a valve 234. In the substrate holder 2, when the valve 234 is opened under the control of the controller 8, a gas that is used to adsorb the substrate 9 is supplied to the gas passage 231 and sprayed out from the gas delivery ports 232.

In the case where the gas supplied to the upper nozzle 511 and the gas supplied to the gas passage 231 of the substrate holder 2 are of the same type, one gas supply source may be used in common as the gas supply source 518 and the gas supply source 235.

FIG. 8 is a plan view showing one example of a substrate 9 that is processed by the substrate processing apparatus 1. FIG. 9 is a sectional view of the substrate 9 taken at a position IX-IX in FIG. 8. In the illustration of FIG. 9, the thickness of the substrate 9 is greater than the actual thickness. The substrate 9 illustrated in FIGS. 8 and 9 has a peripheral edge portion 94 and a main portion 95. In FIG. 8, the boundary between the peripheral edge portion 94 and the main portion 95 is indicated by the thin line. The peripheral edge portion 94 is an approximately circular ring-shaped portion along the outer peripheral edge of the substrate 9 in plan view, and includes the outer peripheral edge of the substrate 9. The main portion 95 is an approximately circular portion in plan view and located radially inward of the peripheral edge portion 94. The main portion 95 extends radially inward from the inner peripheral edge of the peripheral edge portion 94. The entire circumference of the main portion 95 is surrounded by the peripheral edge portion 94. For example, the substrate 9 may have a diameter of 300 mm, the main portion 95 may have a diameter greater than or equal to 290 mm and less than or equal to 296 mm, and the peripheral edge portion 94 may have a width greater than or equal to 2 mm and less than or equal to 5 mm in the radial direction.

The upper surface 91 of the main portion 95 of the substrate 9 is recessed downward of that of the peripheral edge portion 94. The lower surface 92 of the main portion 95 of the substrate 9 is located at approximately the same position in the up-down direction as that of the peripheral edge portion 94. That is, the space above the main portion 95 of the substrate 9 is a recess. The thickness of the main portion 95 of the substrate 9 may, for example, be less than or equal to 200 μm. That is, the substrate 9 is a thin substrate whose radial central portion has a thickness less than or equal to 200 μm. The thickness of the main portion 95 of the substrate 9 may, for example, be greater than or equal to 10 μm and less than or equal to 200 μm. The thickness of the peripheral edge portion 94 of the substrate 9 may, for example, be greater than or equal to 600 μm and less than or equal to 1000 μm. For example, the substrate 9 may be formed by performing a grinding process (i.e., grinding) on a portion of a substrate with an approximately uniform thickness that corresponds to the main portion 95.

FIG. 10 is a flowchart of processing performed on a substrate 9 by the substrate processing apparatus 1. In the substrate processing apparatus 1, first, a substrate 9 is held by the substrate holder 2 illustrated in FIG. 2 (step S11). As described above, the substrate holder 2 holds the substrate 9 in a horizontal position by the Bernoulli effect resulting from the gas sent out from the gas supply parts 23, while being in contact with the outer peripheral portion of the lower surface 92 of the substrate 9 at the support pins 22 and not being in contact with the central portion of the lower surface 92 of the substrate 9. In the substrate holder 2, the gas in the lower space 90 illustrated in FIG. 5 flows radially outward through the space below the outer peripheral edge of the substrate 9 and flows into the annular passage 264 through the space below the annular space 263. The gas then flows radially outward through the annular passage 264, flows out radially outward from the outer peripheral edge of the annular passage 264 (i.e., the outer peripheral edge of the substrate holder 2), and flows into the cup part 4 (see FIG. 2).

When the substrate 9 is held by the substrate holder 2 as illustrated in FIG. 2, the substrate rotation mechanism 33 rotates the substrate 9 together with the substrate holder 2 about the central axis J1 (step S12). Then, the spray of the processing liquid from the upper nozzle 511 toward the upper surface 91 of the rotating substrate 9 is started. The upper nozzle 511 is continuously and reciprocally moved between the first position and the second position by the processing-part movement mechanism 52, the first position facing the central portion of the upper surface 91 of the substrate 9 in the up-down direction, and the second position being located radially outward of the first position. The second position may, for example, be a position facing, in the up-down direction, a virtual circumference on which the support pins 22 are arranged. Accordingly, a physical cleaning process is performed on the upper surface 91 of the substrate 9 (step S13).

The processing liquid supplied to the upper surface 91 of the rotating substrate 9 is caused by centrifugal force to flow from the central portion of the substrate 9 toward the outer peripheral edge thereof. The processing liquid flows from the outer peripheral edge of the substrate 9 to above the division plate 26 through above the annular space 263 and flows radially outward along the upper surface 261 of the division plate 26 or through above the upper surface 261 of the division plate 26. This reduces the possibility that the processing liquid may flow downward of the lower surface 92 of the substrate 9, and suppresses the adhesion of the processing liquid to the lower surface 92 of the substrate 9. The processing liquid flowing radially outward above the division plate 26 is dispersed radially outward from the outer peripheral edge of the division plate 26 (i.e., the outer peripheral edge of the substrate holder 2) and received by the cup part 4.

As described above, the substrate processing apparatus 1 includes the substrate holder 2, the substrate rotation mechanism 33, and the processing-liquid supply part (i.e., processing part 51). The substrate holder 2 holds a substrate 9 in a horizontal position. The substrate rotation mechanism 33 rotates the substrate holder 2 about the central axis J1 extending in the up-down direction. The processing part 51 supplies a processing liquid to the upper surface 91 of a substrate 9. The substrate holder 2 includes the base part 21, the support pins 22, the gas supply part 23, and the ring-shaped division plate 26. The base part 21 has the base surface 211. The base surface 211 faces the lower surface 92 of the substrate 9 and extends radially outward from the outer peripheral edge of the substrate 9. The support pins 22 are aligned in the circumferential direction on the base surface 211 and protrude upward from the base surface 211. The support pins 22 come in contact with the outer peripheral portion of the lower surface 92 of the substrate 9. The gas supply part 23 sends out a gas between the lower surface 92 of the substrate 9 and the base surface 211 of the base part 21 to form an airflow that flows radially outward. The division plate 26 is arranged radially outward of the outer peripheral edge of the substrate 9 on the base surface 211 of the base part 21 and surrounds the circumference of the substrate 9.

The inner peripheral edge of the division plate 26 and the outer peripheral edge of the substrate 9 face each other in the radial direction with a space in between. The upper surface 261 of the division plate 26 is located below or at the same position in the up-down direction as the upper surface 91 of the substrate 9. The annular passage 264 is provided between the lower surface 262 of the division plate 26 and the base surface 211 of the base part 21. The division plate 26 is fixedly attached to the base part 21 and rotated together with the base part 21 by the substrate rotation mechanism 33.

Accordingly, the gas flowing radially outward from the lower space 90 between the substrate 9 and the base part 21 flows into the annular passage 264 through below the annular space 263 and flows radially outward as described above. On the other hand, the processing liquid supplied to the upper surface 91 of the rotating substrate 9 flows to above the division plate 26 through above the annular space 263 and is dispersed radially outward through above the division plate 26. This reduces the possibility that the processing liquid on the upper surface 91 of the substrate 9 or the processing liquid or the like dispersed from the outer peripheral edge of the substrate 9 may flow around to the underside of the substrate 9, and thereby suppresses the adhesion of the processing liquid to the lower surface 92 of the substrate 9.

As described above, it is preferable that the substrate holder 2 adsorbs the substrate 9 by creating a pressure drop in the space between the substrate 9 and the base part 21 (i.e., lower space 90) by the Bernoulli effect resulting from the aforementioned airflow. In this way, since a negative pressure is created in the lower space 90 in the substrate processing apparatus 1 that holds the substrate 9 by the Bernoulli chuck, the processing liquid is likely to flow around to the lower surface of the substrate 9 by the negative pressure. As described above, since the substrate processing apparatus 1 is capable of reducing the possibility that the processing liquid may flow around to the underside of the substrate 9, the structure of the substrate processing apparatus 1 is in particular suitable for a substrate processing apparatus that includes a Bernoulli chuck.

As described above, it is preferable that the lower surface 262 of the division plate 26 is an inclined surface that is inclined downward in a radially outward direction. In this case, the gas that flows radially outward from the lower space 90 between the substrate 9 and the base part 21 can be guided diagonally downward from the vicinity of the outer peripheral edge of the substrate 9. As a result, it is possible to increase the adsorption power of the substrate 9 resulting from the Bernoulli effect and to tightly hold the substrate 9.

As described above, it is preferable that the distance in the up-down direction between the lower surface 92 of the substrate 9 and the base surface 211 at a radial position at which the substrate 9 comes in contact with the support pins 22 is smaller than the distance in the up-down direction between the lower surface 262 of the division plate 26 and the base surface 211 at a position below the inner peripheral edge of the division plate 26. In this way, the flow rate of the gas can be reduced by increasing the cross-sectional area of the gas passage through which the gas flows radially outward from the lower space 90 between the substrate 9 and the base part 21 in the vicinity of the outer peripheral edge of the substrate 9. This makes it possible to suppress a pressure drop created by the flow of the gas in the vicinity of the outer peripheral edge of the substrate 9 (i.e., in the vicinity of the annular space 263). As a result, it is possible to reduce the possibility that the processing liquid flowing through above the annular space 263 may be drawn downward of the substrate 9 via the annular space 263 by the pressure drop. Accordingly, it is possible to further suppress the adhesion of the processing liquid to the lower surface 92 of the substrate 9.

As described above, the substrate holder 2 further includes pins (in the example described above, the centering pins 25) that protrude above from the base surface 211 on the outer side of the substrate 9 in the radial direction. It is preferable that the upper end portions of these pines are inserted in the openings 265 provided in the division plate 26, and that the upper ends of these pins are located below or at the same position in the up-down direction as the region of the upper surface 261 of the division plate 26 that are located around the opening 265. This reduces the possibility that the processing liquid dispersed radially outward from the outer peripheral edge of the substrate 9 may collide with these pins and bound off radially inward (i.e., toward the substrate 9) due to the collision with the pins. As a result, it is possible to further suppress the adhesion of the processing liquid to the lower surface 92 of the substrate 9.

The substrate processing apparatus 1 described above may be modified in various ways.

For example, the number and shape of the support pins 22 are not limited to those described in the above example, and may be modified in various ways. The same applies to the lift pins 24 and the centering pins 25.

The upper ends of the centering pins 25 may be located above the regions of the upper surface 261 of the division plate 26 that are located around the openings 265. In other words, the centering pins 25 may protrude upward from the upper surface 261 of the division plate 26.

In the substrate holder 2, the number, shape, and arrangement of the gas delivery ports 232 are not limited to those described in the above example, and may be modified in various ways. For example, the number of gas delivery ports 232 may be one. In this case, for example, one gas delivery port 232 with an approximately circular shape in plan view may be provided on the central axis J1 at the position facing the central portion of the lower surface 92 of the substrate 9 in the up-down direction, or one gas delivery port 232 with an approximately circular ring shape in plan view may be provided around the central axis J1.

In the substrate holder 2, the shape of the base surface 211 is not limited to that described in the above example, and may be modified in various ways. The shapes of the upper surface 261 and the lower surface 262 of the division plate 26 are also not limited to those described in the above example, and may be modified in various ways. For example, the lower surface 262 of the division plate 26 does not necessarily have to be an inclined surface that is inclined downward in a radially outward direction, and may be a surface that extends approximately horizontally.

The height of the lower space 90 at a radial position at which the substrate 9 comes in contact with the support pins 22 may be greater than or equal to the height of the annular passage 264 at a position below the inner peripheral edge of the division plate 26.

In the substrate processing apparatus 1, in the case where a lower nozzle is provided in the central portion of the base part 21 (i.e., below the central portion of the substrate 9), a gas may flow at a low flow rate to the lower space 90 from, for example, clearance between the lower nozzle and the base part 21, with a pressure drop created in the lower space 90 by the Bernoulli effect.

In the substrate processing apparatus 1, the substrate holder 2 does not necessarily have to be a Bernoulli chuck, and may, for example, a mechanical chuck or any other chuck. In this case, for example, the gas flowing from the gas supply part 23 may be supplied to, for example, a radial central portion of the lower space 90 and form an airflow that flows radially outward for the purpose of, for example, purging the lower space 90 with this gas.

The substrates 9 that are processed by the substrate processing apparatus 1 do not necessarily have to be substrates whose main portions 95 are thinner than the peripheral edge portions 94 as illustrated in FIGS. 8 and 9, and may be substrates with an approximately uniform thickness along approximately the entire surface. The thickness, diameter, and shape of the substrates 9 may be modified in various ways.

In addition to semiconductor substrates, the aforementioned substrate processing apparatus 1 may also be used to process glass substrates for use in display devices such as liquid crystal displays, plasma displays, and field emission displays. Alternatively, the aforementioned substrate processing apparatus 1 may be used to process other substrates such as optical disk substrates, magnetic disk substrates, magneto-optical disk substrates, photomask substrates, ceramic substrates, and solar cell substrates.

The configurations of the preferred embodiments and variations described above may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1 Substrate processing apparatus
2 Substrate holder
9 Substrate
21 Base part
22 Support pin
23 Gas supply part
25 Centering pin
26 Division plate
33 Substrate rotation mechanism
51 Processing part
90 Lower space
91 Upper surface (of substrate)
92 Lower surface (of substrate)
211 Base surface
252 Upper pin portion
261 Upper surface (of division plate)
262 Lower surface (of division plate)
264 Annular passage
265 Opening
J1 Central axis

The invention claimed is:

1. A substrate processing apparatus for processing a substrate, comprising:
    a substrate holder that holds a substrate in a horizontal position;
    a substrate rotator that rotates said substrate holder about a central axis extending in an up-down direction; and
    a processing liquid supplier that supplies a processing liquid to an upper surface of said substrate,
    wherein said substrate holder includes:
    a base part having a base surface that faces a lower surface of said substrate and that extends radially outward from an outer peripheral edge of said substrate;
    a plurality of support pins that are arranged in a circumferential direction on said base surface, that project upward from said base surface, and that come in contact with an outer peripheral portion of said lower surface of said substrate;
    a gas supplier that sends out a gas to a space between said lower surface of said substrate and said base surface of said base part to form an airflow that flows radially outward; and
    a ring-shaped division plate that is arranged radially outward of the outer peripheral edge of said substrate on said base surface of said base part to surround a circumference of said substrate, and
    an inner peripheral edge of said division plate and said outer peripheral edge of said substrate face each other in a radial direction with a space in between,
    said division plate has an upper surface that is located below or at the same position in the up-down direction as said upper surface of said substrate,
    an annular passage is provided between a lower surface of said division plate and said base surface of said base part,
    said division plate is fixedly attached to said base part and is rotated together with said base part by said substrate rotation mechanism, said substrate holder produces a pressure drop in a space between said substrate and said base part by a Bernoulli effect resulting from said airflow to adsorb said substrate, said gas supplier includes a plurality of gas delivery ports that spray out the gas, when the substrate holder holds said substrate, the inner peripheral edge of said division plate is adjacent to the outer edge of said substrate, and a first flow path is formed between said base surface and the lower surface of said substrate, and said first flow path connects said plurality of gas delivery ports to said annular passage and directs the gas to said annular passage.

2. The substrate processing apparatus according to claim 1, wherein said lower surface of said division plate is an inclined surface that is inclined downward in a radially outward direction.

3. The substrate processing apparatus according to claim 1, wherein a distance in the up-down direction between said base surface and said lower surface of said substrate at a radial position at which said substrate comes in contact with said plurality of support pins is smaller than a distance in the up-down direction between said base surface and said lower surface of said division plate at a position below said inner peripheral edge of said division plate.

4. The substrate processing apparatus according to claim 1, wherein said substrate holder further includes a pin that protrudes upward from said base surface at a position radially outward of said substrate, said pin has an upper end portion that is inserted in an opening formed in said division plate, and said pin has an upper end that is located below or at the same position in the up-down direction as a region of said upper surface of said division plate that is located around said opening.

\* \* \* \* \*